(12) United States Patent
Centofante

(10) Patent No.: US 7,440,285 B2
(45) Date of Patent: Oct. 21, 2008

(54) ELECTRONIC DEVICE HOUSING

(75) Inventor: Charles A. Centofante, Los Altos, CA (US)

(73) Assignee: Piranha Plastics, LLC, Santa Clara, CA (US)

( * ) Notice: Subject to any disclaimer, the term of this patent is extended or adjusted under 35 U.S.C. 154(b) by 0 days.

(21) Appl. No.: 11/618,589

(22) Filed: Dec. 29, 2006

(65) Prior Publication Data

US 2008/0158789 A1 Jul. 3, 2008

(51) Int. Cl.
*H05K 1/14* (2006.01)
(52) U.S. Cl. ...................................... 361/737; 361/715
(58) Field of Classification Search ................. 361/737, 361/715, 752, 790, 797, 800; 40/299.01; 220/500, 529
See application file for complete search history.

(56) References Cited

U.S. PATENT DOCUMENTS

| | | | |
|---|---|---|---|
| 4,972,580 A * | 11/1990 | Nakamura | 29/840 |
| 5,057,460 A | 10/1991 | Rose | |
| 5,196,994 A | 3/1993 | Tanuma et al. | |
| 5,244,840 A | 9/1993 | Kodai et al. | |
| 5,350,713 A | 9/1994 | Liang | |
| 5,376,824 A | 12/1994 | Rauchmaul et al. | |
| 5,406,699 A | 4/1995 | Oyama | |
| 5,416,358 A * | 5/1995 | Ochi et al. | 257/666 |
| 5,833,785 A | 11/1998 | Centofante | |
| 5,833,903 A | 11/1998 | Centofante | |
| 5,964,595 A | 10/1999 | Centofante | |
| 6,028,774 A | 2/2000 | Shin et al. | |
| 6,040,622 A | 3/2000 | Wallace | |
| 6,085,412 A | 7/2000 | Iwasaki | |
| 6,137,224 A | 10/2000 | Centofante | |
| 6,139,304 A | 10/2000 | Centofante | |
| 6,295,207 B1 | 9/2001 | Jones | |
| 6,381,143 B1 | 4/2002 | Nakamura | |
| 6,469,902 B1 | 10/2002 | Puschner et al. | |
| 6,483,038 B2 | 11/2002 | Lee et al. | |
| 6,501,163 B1 * | 12/2002 | Utsumi | 257/679 |
| 6,539,623 B1 | 4/2003 | Chen | |
| 6,590,778 B1 * | 7/2003 | Hojo et al. | 361/737 |
| 6,617,786 B1 | 9/2003 | Centofante | |
| 6,632,997 B2 | 10/2003 | Hoffman et al. | |
| 6,665,190 B2 | 12/2003 | Clayton et al. | |
| 6,774,469 B2 * | 8/2004 | Utsumi | 257/679 |
| 6,779,260 B1 | 8/2004 | Brandenburg et al. | |
| 6,933,929 B1 * | 8/2005 | Novak | 345/173 |
| 7,109,427 B1 | 9/2006 | Ng | |
| 7,151,623 B2 * | 12/2006 | Leiber et al. | 359/3 |
| 7,223,512 B2 * | 5/2007 | Lutz et al. | 430/200 |
| 2002/0131245 A1 | 9/2002 | Clayton et al. | |
| 2004/0240190 A1 * | 12/2004 | Hsu et al. | 361/797 |

* cited by examiner

*Primary Examiner*—Hung S Bui
(74) *Attorney, Agent, or Firm*—Fish & Richardson P.C.

(57) ABSTRACT

Apparatus and methods for housing an electronic device are provided. In some implementations an apparatus is provided. The apparatus includes a base, an electronic device positioned on the base, and a lid positioned to cover the base and at least a portion of the electronic device. The lid and the base form a housing for the electronic device, the lid including a lid aperture, the lid aperture exposing at least a portion of the electronic device. The apparatus also includes a transparent portion positioned such that a first region of the transparent portion is positioned within the lid aperture and where at least a portion of the electronic device is covered by the transparent portion.

19 Claims, 6 Drawing Sheets

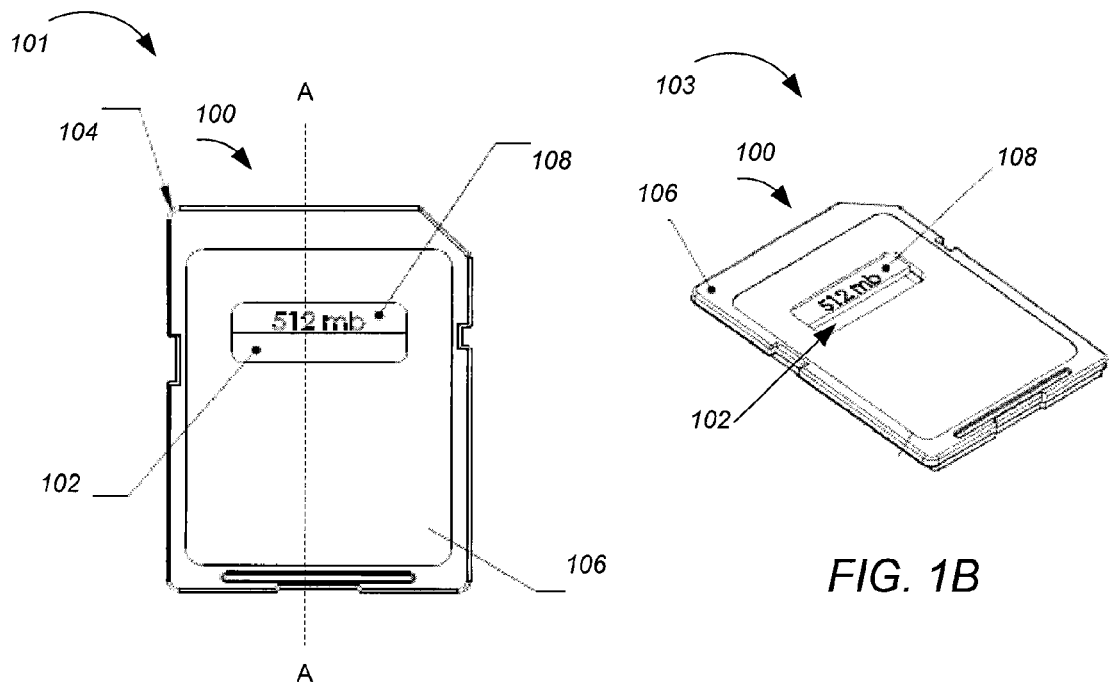
FIG. 1A
FIG. 1B
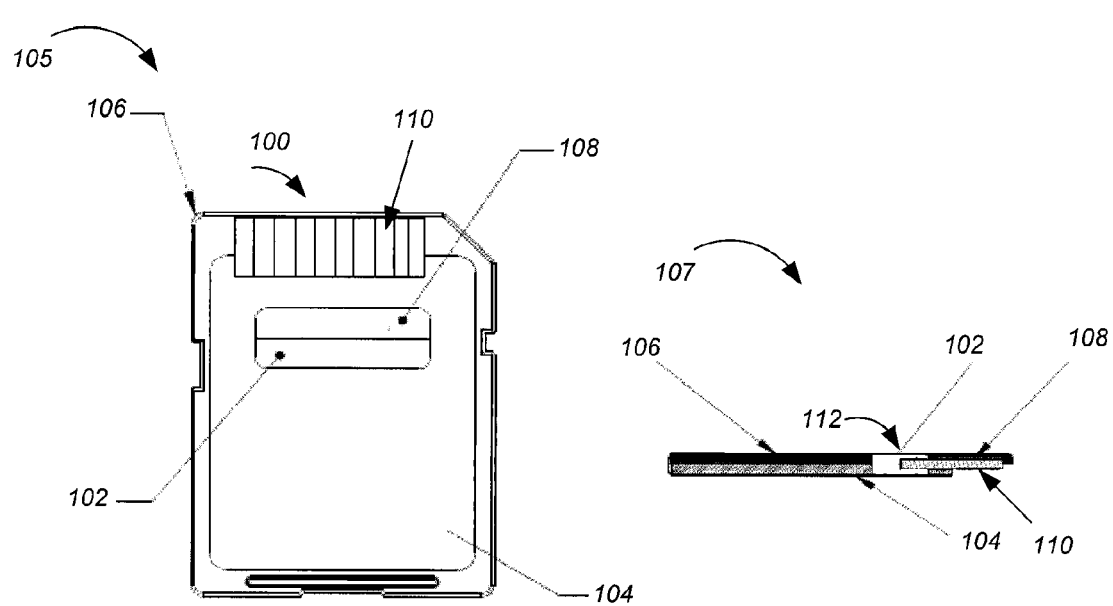
FIG. 1C
FIG. 1D

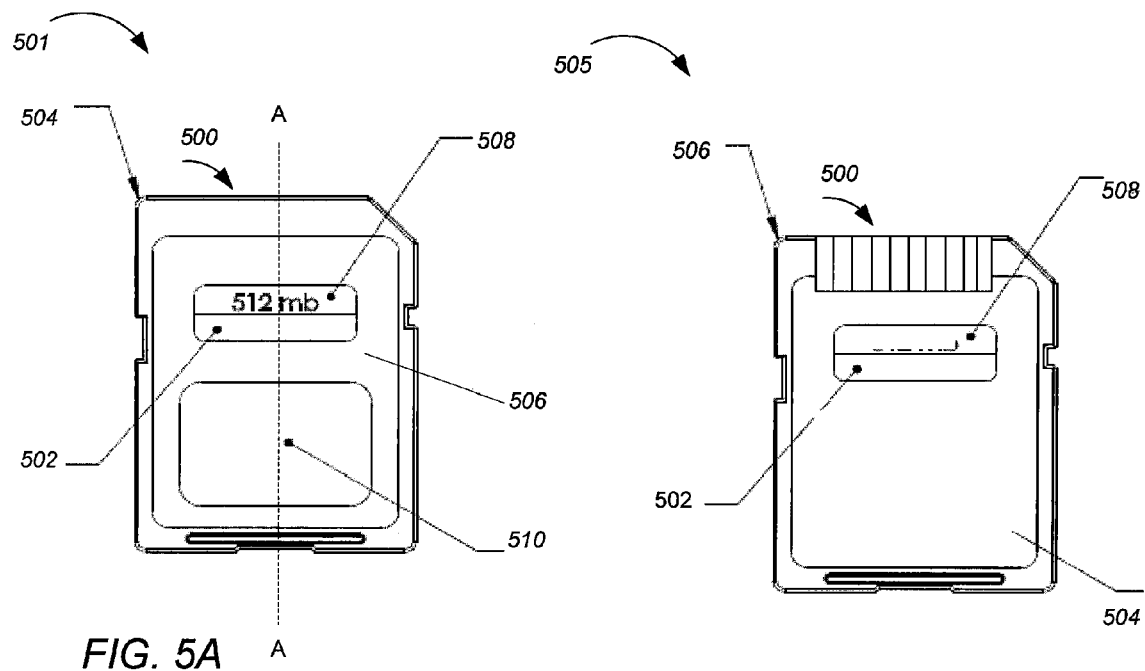
FIG. 5A
FIG. 5B
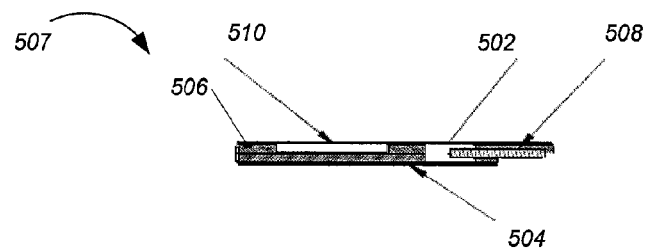
FIG. 5C

ELECTRONIC DEVICE HOUSING

BACKGROUND

This specification relates to housing an electronic device.

Computer memory and other peripheral devices can be built into a computer or can be external devices selectively attachable to a computer through an external interface. Certain peripheral devices are small enough to be housed in small, thin, card-shaped packages that are intended to be inserted into specially designed receptacles, typically found, for example, in portable personal computers or digital cameras. Because of the many possible methods of constructing the interface between the computer and such devices, standards have been developed by the Personal Computer Memory Card International Association ("PCMCIA"), Japan Electronic Data Interchange Council ("JEDIC"), International Organization for Standardization ("ISO"), Compact Flash Association ("CFA"), and others. Standards specify the shape and size of the device housing as well as the design of the connector/computer interface. Such peripheral devices, which may or may not conform to an industry standard, are generally referred to as PC cards.

Counterfeiting is a concern of PC card manufacturers. For example, counterfeiters can replace the labeling on a PC card housing to misrepresent the contents of the PC card (e.g., misrepresenting a flash memory PC card as having a greater storage capacity). Additionally, counterfeiters can replace the electronic device housed within the PC card with one of lower quality and misrepresent the PC card as authentic.

SUMMARY

Apparatus and methods for housing an electronic device are provided. In general, in one aspect, an apparatus is provided. The apparatus includes a base, an electronic device positioned on the base, and a lid positioned to cover the base and at least a portion of the electronic device. The lid and the base form a housing for the electronic device, the lid including a lid aperture, the lid aperture exposing at least a portion of the electronic device. The apparatus also includes a transparent portion positioned such that a first region of the transparent portion is positioned within the lid aperture and where at least a portion of the electronic device is covered by the transparent portion.

Implementations of the apparatus can include one or more of the following features. The base further can include a base aperture. The transparent portion can further include a top panel corresponding to the lid aperture, a bottom panel corresponding to the base aperture, and a side panel coupling the top panel and the bottom panel, where the transparent portion has a substantially U-shaped cross section. The top panel can have a surface area less than the surface area of the lid. The electronic device can be partially positioned within a cavity formed by the U-shaped cross section of the transparent portion.

The transparent portion can further include a top panel corresponding to the lid aperture, and a side panel coupled to the top panel, the side transparent panel having a bottom surface corresponding to the base aperture, where the portion has a substantially L-shaped cross section. The transparent portion can hold the electronic device in position relative to the base during assembly. The portion of the electronic device covered by the transparent portion can include identifying information. The identifying information can include printed data. The identifying information can include a size of the electronic device.

The lid can include a second lid aperture, the apparatus further including a transparent panel positioned on the base, the transparent panel configured to fit within the second lid aperture. The apparatus can further include a holographic layer, the holographic layer positioned between the base and the transparent panel.

The lid can include a recess, the apparatus further including a transparent panel positioned within the recess. The apparatus can further include a holographic layer, the holographic layer positioned between the lid and the transparent panel.

In general, in one aspect, a method is provided. The method includes receiving a base, the base having a base aperture, receiving an electronic device, and positioning a transparent portion as covering a portion of the electronic device. The method also includes positioning the electronic device with the transparent portion on the base, the transparent portion including a surface configured to fit within the base aperture, the transparent portion holding the electronic device in place on the base and positioning a lid on the base to form a housing for the electronic device, the lid including a lid aperture, the transparent portion having a top surface configured to fit within the lid aperture.

Implementations of the method can include one or more of the following features. Positioning the lid can include overmolding the lid onto the base. Positioning the lid can include sonic welding the lid onto the base. Positioning the transparent portion as covering a portion of the electronic device can include adhering the transparent portion to the electronic device.

Particular embodiments of the subject matter described in this specification can be implemented to realize one or more of the following advantages. Adding a transparent portion to the PC card allows authentic PC cards to be quickly and efficiently identified. Markings directly on the electronic device, which are visible through the transparent portion of the PC card housing, allow individuals to confirm the PC card is authentic. Additionally, users can observe the physical size of the electronic device itself, allowing the users to quickly identifying small electronic device sizes indicative of particular manufacturers. Additionally, assembly of the PC card can be improved by using the transparent portion to locate and position an electronic device within the housing of the PC card. The transparent portion can also provided greater strength and stability to the PC card as well as reduce manufacturing stresses.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 1A shows a top view of an example PC card including a transparent portion.

FIG. 1B shows a perspective view of the PC card of FIG. 1A.

FIG. 1C shows a bottom view of the PC card of FIG. 1A.

FIG. 1D shows a cross sectional view along line A-A of the PC card shown in FIG. 1A.

FIG. 5A shows a top view of an example PC card including a security panel.

FIG. 5B shows a bottom view of the PC card of FIG. 5A.

FIG. 5C shows a cross sectional view along line A-A of the PC card shown in FIG. 5A.

Like reference numbers and designations in the various drawings indicate like elements.

DETAILED DESCRIPTION

Figure 2:
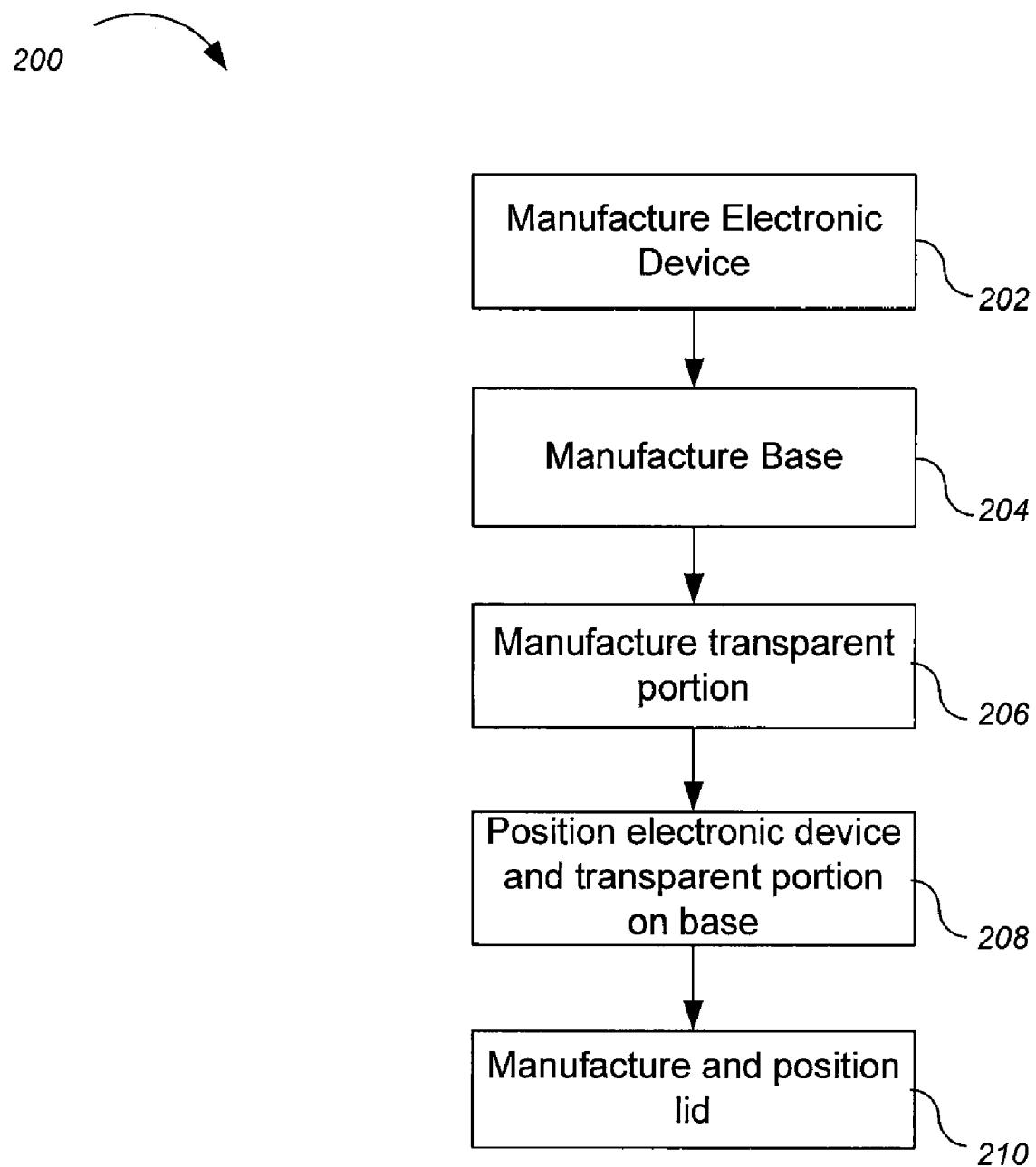
FIG. 2 shows an example process for assembling a PC card.

FIG. 1A shows a top view 101 of a PC card 100 including a transparent portion 102. FIG. 1B shows a perspective view 103 of the PC card 100 of FIG. 1A. In addition to the transparent portion 102, the PC card 100 includes a base 104, a lid 106, and electronic device 108 that is partially enclosed by the base 104, the lid 106, and the transparent portion 102.

The base 104 is manufactured, for example, by injection molding or die-cutting. Similarly, the lid 106 is manufactured, for example, by injection molding or die-cutting. In some implementations, the lid 106 is over-molded to the base 104 in order to form a housing for the electronic device 108. The lid 106 and base 104 can be formed from a suitable material, including, for example, a thermoplastic material such as an acrylonitrile butadiene styrene (ABS), polycarbonate, ABS-polycarbonate, styrene, polystyrene, acrylic, nylon or a polyester. The above list is not exhaustive and other suitable materials to form the lid 106 and the base 104 can be used, including non-plastic materials (e.g., metal). Furthermore, a different material can be used for each of the lid 106 and the base 104.

The electronic device 108 can be, for example, a thin walled semiconductor device, such as a printed circuit board (PCB) as shown. The electronic device 108 has an interface 110 that can include, for example, conductor contacts, such as gold traces, for interfacing with one or more electronic devices. The interface 110 can be configured and attached to the electronic device 108 using conventional techniques and optionally, the interface 110 can be configured according to a standard set by CFA, PCMICIA, JEDIC, ISO, or others. The electronic device 108 can include identifying markings on one or more exterior surfaces (e.g., a top, bottom, or sides). For example, the capacity and manufacturer name. Additionally, other identifiers can be provided to provide authenticity information.

When assembled, the housing forms a thin rectilinear solid, with the lid 106 and the base 104 defining planar surfaces of the housing and a shallow side wall, and providing a rigid housing for the electronic device 108 with access to the interface 110. In one embodiment, the PC card can include a PCB configured to form a flash memory module for insertion into an electronic device such as a digital camera or a mobile phone. For example the technique can be used to form a memory module such as the miniSD memory module manufactured by SanDisk, having finished dimensions of approximately 21.5 cm×20.0 cm×1.4 mm.

Additionally, the lid 106 and base 104 include one or more openings corresponding to the transparent portion 102. For example, an aperture can be formed in the lid 106 during manufacture and configured to allow the transparent portion 102 to at least be partially inserted into the aperture. Alternatively, the respective openings can be formed after manufacture but before assembly. In some implementations, a top surface of the transparent portion 102 is configured to be substantially co-planar with a top surface of the lid 106 in the completed PC card 100. Similarly, in some implementations, a bottom surface of the transparent portion 102 is configured to be substantially co-planar with a bottom surface of the base 104 in the completed PC card 100. In some implementations, the opening is substantially rectangular in shape. In some implementations, the opening in the lid 106 is less than the surface area of the lid 106. The opening in the base 104 can be similarly sized. For example, the opening can be a range of 10% to 90% of the surface area of the lid 106.

The transparent portion 102 is positioned to provide visual inspection of a portion of the electronic device 108. For example, the transparent portion 102 allows information written onto the electronic device 108 to be viewed (e.g., capacity, manufacturer logo, security tag, or hologram). Additionally, the transparent portion 102 allows information about the size of the electronic device 108 to be viewed. In some implementations, a manufacturer of electronic devices has a reputation for producing electronic devices having a particular size relative to other manufactures (e.g., smaller). Viewing the physical size of the electronic device 108, using the transparent portion 102, allows visual verification of the manufacturer of the electronic device 108.

Additionally, in an alternative implementation, verification of the electronic device 108 can be provided by illuminating the electronic device. For example, a light (e.g., at one or more particular wavelengths) can be shown through the transparent portion 102 to illuminate the electronic device 108. The illumination can cause a portion of, or markings on, the electronic device 108 to become visible (e.g., by fluorescing). The illumination can be on one or more of the top, bottom, or side surface of the electronic device and can include text or other markings.

The transparent portion 102 can also be configured to hold the electronic device 108 in place, for example, during assembly of the PC card 100 (as described in greater detail below). The transparent portion 102 can be substantially transparent or only partially transparent. Additionally, in some implementations, the degree of transparency varies for different portions of the transparent portion 102. The transparent portion 102 can be formed from a suitable material, including, for example, acrylic, polycarbonate, Styrene Acrylonitrile, K-resin, or nylon. The above list is not exhaustive and other suitable materials to form the transparent portion 102 can be used, including non-plastic materials (e.g., glass).

FIG. 1C shows a bottom view 105 of the PC card 100. The bottom view 100 shows base 104, transparent portion 102, and electronic device 108. As shown in FIG. 1C, the transparent portion 102 extends from the lid 106 to the base 104 partially enclosing the electronic device 108. The base 104 also provides an opening 111 that exposes a portion of the electronic device 108 including the interface 110. The opening 111 allows the PC card to interact with other electronic devices using interface 110.

FIG. 1D illustrates a cross sectional view 107 of the PC card 100 shown in FIG. 1A taken along line A-A. The cross sectional view 107 shows the base 104, the lid 106, electronic device 108, and transparent portion 102. The base 104 and lid 106 form a bottom and top, respectively, for the PC card 100. The electronic device 108 is positioned between the base 104 and the lid 106. In some implementations, a spacing exists between the interior surface of the base 104 and the lid 106 forming a shell. In other implementations, the base 104 and lid 106 are bonded together (e.g., when over-molding the lid to the base) over a portion of the housing.

As shown in FIG. 1D, the transparent portion 102 forms a U-shaped cross section 112. The U-shaped cross section 112 includes an interior void configured to wrap around a portion of the electronic device 108. In some implementations, the U-shaped cross section 112 is configured to hold the electronic device 108 in position (e.g., during assembly of the PC card 100, the transparent portion 102 can hold the electronic device 108 in place while the lid 106 is positioned). The electronic device 108 can be held, for example, by friction or an adhesive. Additionally, as shown in FIG. 1D, the transparent portion 102 extends through the lid 106 and the base 104 such that the transparent portion 102 is exposed from both the top and the bottom of the PC card 100. In some implementations, the exposed surface area is less than the surface area of the lid 106 or the base 104, respectively. In some implementations, the transparent portion 102 wraps around a portion of the electronic device 108, the remainder of the electronic device 108 is held by the base 104 and the lid 106 of the PC card 100.

FIG. 2 shows an example process 200 for assembling a PC card (e.g., PC card 100). An electronic device (e.g., electronic device 108) is manufactured according to an industry standard or otherwise (step 202). A base (e.g., base 104) is manufactured, for example, by injection molding, die-cutting, or otherwise (step 204). An example of an injection molded base shell is disclosed in U.S. Pat. No. 5,833,785, which is incorporated by reference.

A transparent portion (e.g., transparent portion 102) is also manufactured (step 206). The transparent portion can be manufactured, for example, by injection molding, die-cutting, or otherwise. The transparent portion is at least partially transparent, but may be substantially completely transparent. The order of steps 202, 204, and 206 is unimportant; the electronic device, the base, or the transparent portion can be manufactured in any order. Further, a portion of the PC card can be manufactured during the assembly process. For example, the lid 106 can be over-molded onto the base and electronic device during PC card assembly.

The electronic device and transparent portion are positioned on the base (step 208). In some implementations, the electronic device is first positioned on the base followed by the transparent portion. In other implementations, the electronic device is first positioned within the transparent portion and then positioned on the base. For example, for a transparent portion having a U-shaped cross section (e.g., cross section 112 shown above in FIG. 1D), the electronic device can be positioned within the cavity formed by the U-shaped cross section. The electronic device can be held within the transparent portion by friction or an adhesive can be used.

The combination of the electronic device and transparent portion can then be seated on the base. In some implementations, the base includes an aperture corresponding to a side of the transparent portion that can be used to locate both the transparent portion and the electronic device on the base. Additionally, the base can include a recess to further locate and hold the electronic device. Positioning the electronic device in a recess can also provide a thinner PC card. The recess as well as the transparent portion can be used to hold the electronic device in position during assembly, particularly, when positioning a lid on the base to form the PC card. Alternatively, the electronic device can be positioned in a desired position on base and held in place by use of an adhesive, a vacuum system or other convenient means.

A lid (e.g., lid 106) is manufactured and positioned on the base (step 210). The base (e.g., base 104) is manufactured, for example, by injection molding, die-cutting, or otherwise. In some implementations, the manufactured lid is sonic welded to the base. For example, the lid and base can respectively form two halves of a housing shell, each having a raised edge substantially surrounding a perimeter of the lid and base. After positioning the lid on the base, e.g., by aligning the raised edges to form a shell enclosing the electronic device, sonic welding can be applied. Sonic welding uses sound waves passing through both the lid and the base in order to bond them together.

In alternative implementations, the lid is over-molded onto the base. For example, after positioning the electronic device and transparent portion on the base, the base can be positioned within an injection molding device. The mold cavity can be configured to inject a thermoplastic material to generate a lid covering a portion of the base and the electronic device. Different shut off mechanisms can be used in the mold to prevent the injected thermoplastic from covering particular portions, for example to prevent the injected thermoplastic from covering the transparent portion. The injected thermoplastic bonds with the exposed surface of the base in order to form a ridged housing. An example of over-molding can be found in U.S. Pat. No. 7,030,316, which is incorporated by reference.

Figure 3A:
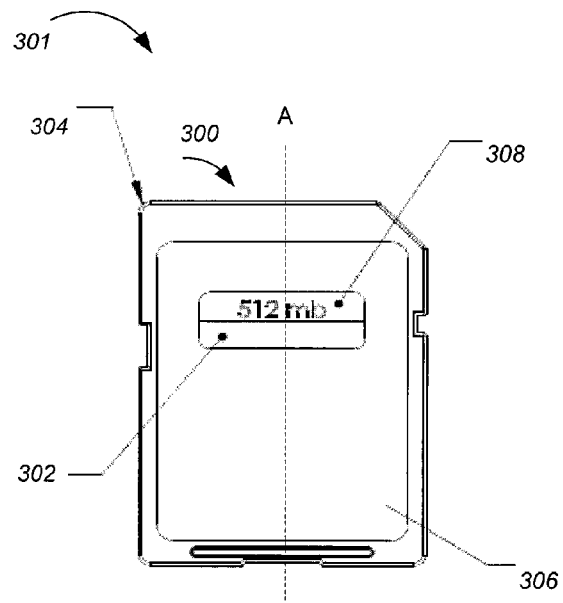
FIG. 3A shows a top view of an example PC card including a transparent portion.
Figure 3B:
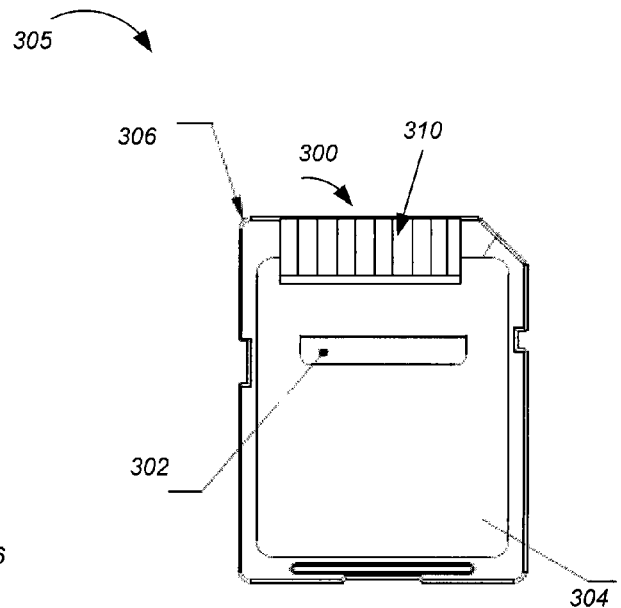
FIG. 3B shows a bottom view of the PC card of FIG. 3A.

FIG. 3A shows a top view 301 of a PC card 300 including a transparent portion 302. FIG. 3B shows a bottom view 305 of the PC card 300 of FIG. 3A. In addition to the transparent portion 302, the PC card 300 includes a base 304, a lid 306, and electronic device 308 that is partially enclosed by the base 304 and the lid 306.

As with the PC card 100 shown in FIG. 1, the base 304 can be manufactured, for example, by injection molding or die-cutting. The lid 306 can be manufactured, for example, by injection molding, die-cutting, or over-molded into position.

The lid 306 and base 304 include an opening in a surface of the lid 306 and base 304, respectively, corresponding to the transparent portion 302. The opening in each surface is smaller than the surface area of the lid 306 or base 304. Additionally, as shown in FIGS. 3A and 3B, the exposed surface area of the transparent portion 302 is smaller on the base 304 than the lid 306.

The transparent portion 302 is positioned to provide visual inspection of a portion of the electronic device 308. For example, the transparent portion allows information written, printed, or adhered onto the electronic device 308 to be viewed (e.g., capacity, manufacturer logo, security tag, or hologram). Additionally, the transparent portion 302 allows information about the size of the electronic device 308 to be viewed.

Figure 3C:
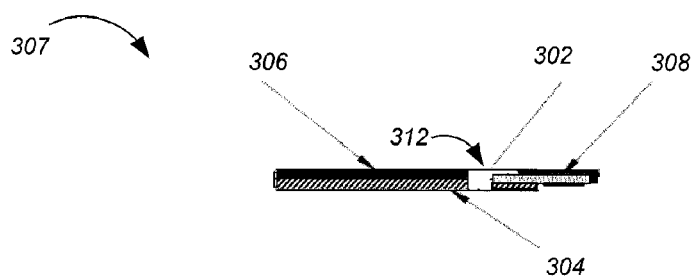
FIG. 3C shows a cross sectional view along line A-A of the PC card shown in FIG. 3A.

FIG. 3C shows a cross sectional view 307 along line A-A of the PC card 300 shown in FIG. 3A. The cross sectional view 307 shows the base 304, the lid 306, electronic device 308, and transparent portion 302. The base 304 and lid 306 form a bottom and top, respectively, for the PC card 300. The electronic device 308 is positioned between the base 304 and the lid 306.

As shown in FIG. 3C, the transparent portion 302 has an L-shaped cross section 312. The L-shaped cross section 312 defines an interior region configured to wrap around a portion of the electronic device 308. In some implementations, the L-shaped cross section 312 is configured to hold the electronic device 308 in position (e.g., during assembly of the PC card 300, the transparent portion 302 can hold the electronic device 308 in place while lid 306 is positioned). Additionally, as shown in FIG. 3C, the transparent portion 302 extends through the lid 306 and base 304 such that the transparent portion 302 is exposed from both the top and the bottom of the PC card 300. In some implementations, the transparent portion 302 wraps around a portion of the electronic device 308, the remainder of the electronic device 308 is held by the base 304 and lid 306 of the PC card 300.

Figure 4A:
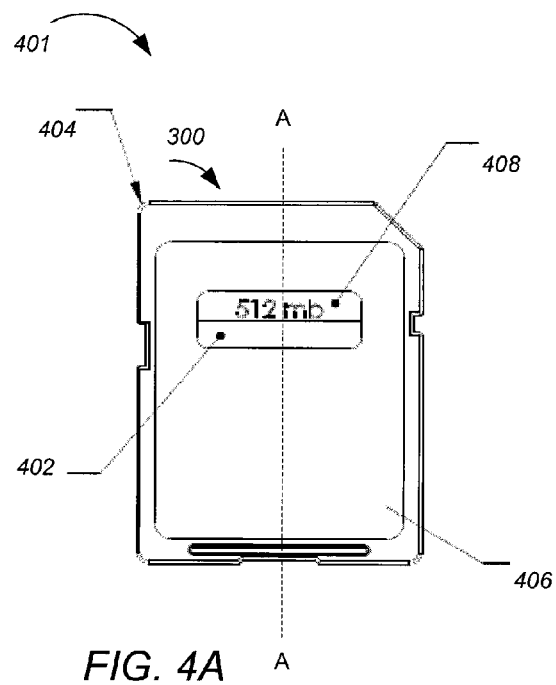
FIG. 4A shows a top view of an example PC card including a transparent panel.
Figure 4B:
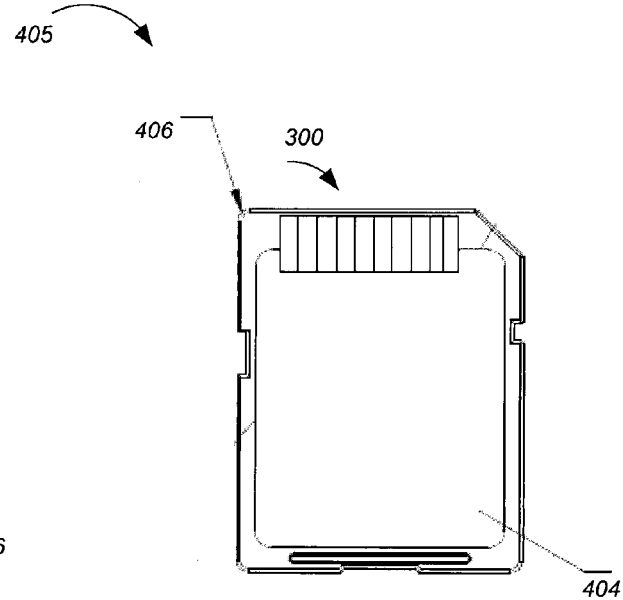
FIG. 4B shows a bottom view of the PC card of FIG. 4A.

FIG. 4A shows a top view 401 of a PC card 400 including a transparent panel 402. FIG. 4B shows a bottom view 405 of the PC card 400 of FIG. 4A. In addition to the transparent panel 402, the PC card 400 includes a base 404, a lid 406, and electronic device 408 that is partially enclosed by the base 404 and the lid 406.

As with the PC card 100 shown in FIG. 1, the base 404 can be manufactured, for example, by injection molding or die-cutting. The lid 406 can be manufactured, for example, by injection molding, die-cutting, or over-molded into position.

The lid 406 includes an opening corresponding to the transparent panel 402. The opening is smaller than the surface area of the lid 406. The transparent panel 402 is positioned to provide visual inspection of a portion of the electronic device 408. For example, the transparent panel 402 allows information written onto the electronic device 408 to be viewed (e.g., capacity, manufacturer logo, security tag, hologram, etc.). Additionally, the transparent panel 402 allows information about the size of the electronic device 408 to be viewed.

Figure 4C:
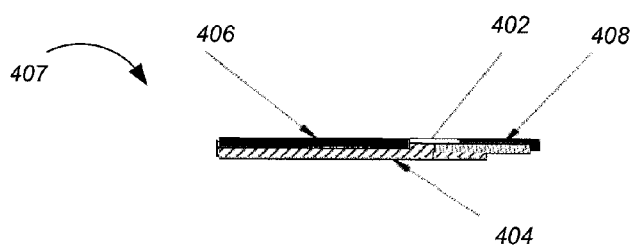
FIG. 4C shows a cross sectional view along line A-A of the PC card shown in FIG. 4A.

FIG. 4C shows a cross sectional view 407 along line A-A of the PC card 400 shown in FIG. 4A. The cross sectional view 407 shows the base 404, the lid 406, electronic device 408, and transparent panel 402. The base 404 and lid 406 form a bottom and top, respectively, for the PC card 400. The electronic device 408 is positioned between the base 404 and the lid 406.

As shown in FIG. 4C, the transparent panel 402 has a planar cross section 412. The planar cross section 412 allows the transparent panel 403 to be positioned flat on a portion of the electronic device 408. Additionally, as shown in FIG. 4C, the transparent panel 402 extends through the lid 406 such that the transparent panel 402 is exposed from the top of the PC card 400. However, in this implementation, the transparent portion 400 is not exposed from the bottom of the PC card 400.

FIG. 5A shows a top view 501 and FIG. 5B shows a bottom view 505, respectively, of a PC card 500 including a security panel 510. In addition to the security panel 510, the PC card 500 includes a base 504, a lid 506, a transparent portion 502, and electronic device 508 that is partially enclosed by the base 504 and the lid 506.

The lid 506 includes an opening corresponding to the transparent panel 502. The transparent panel 502 is positioned to provide visual inspection of a portion of the electronic device 508. For example, the transparent panel 502 allows information written onto the electronic device 508 to be viewed (e.g., capacity, manufacturer logo, security tag, or hologram). Additionally, the transparent panel 502 allows information about the size of the electronic device 508 to be viewed.

The security panel 510 is a transparent or partially transparent panel. The security panel 510 can be positioned within a recess in the lid 506 or, alternatively, can be positioned within an aperture formed in the lid 506 such that the security panel 510 at least partially rests on the base 504. A security feature can be positioned between a bottom surface of the security panel 510 and a portion of the housing. The security feature can be, for example, a holographic film or other indicator of authenticity. For example, the holographic film can be adhered to the bottom surface of the security panel 510 such that the holographic film can be viewed through the security panel 510. Alternatively, the security feature can be positioned on a portion of the housing (e.g., within a recess of the lid 506 or on the base 506) and the security panel 510 positioned over or at least a portion of the security feature.

FIG. 5C shows a cross sectional view 507 along line A-A of the PC card 500 shown in FIG. 5A. The cross sectional view 507 shows the base 504, the lid 506, the electronic device 508, the transparent panel 502, and the security panel 510. The base 504 and lid 506 form a bottom and top, respectively, for the PC card 500. The electronic device 508 is positioned between the base 504 and the lid 506. The security panel 510 is positioned within an opening of the lid 506.

Figure 6A:
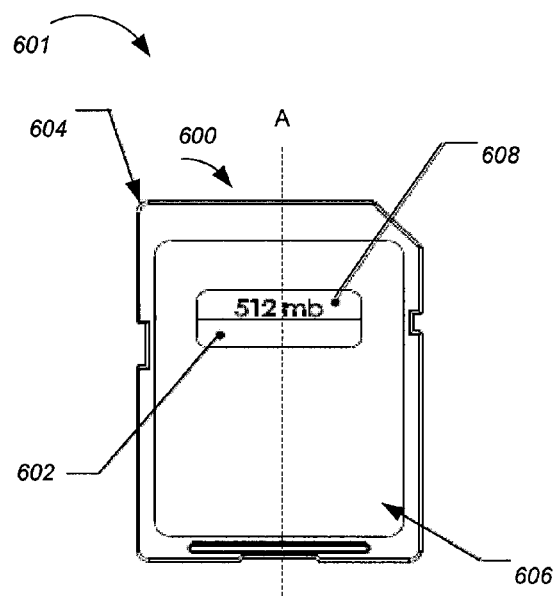
FIG. 6A shows a top view of an example PC card including a transparent panel.
Figure 6B:
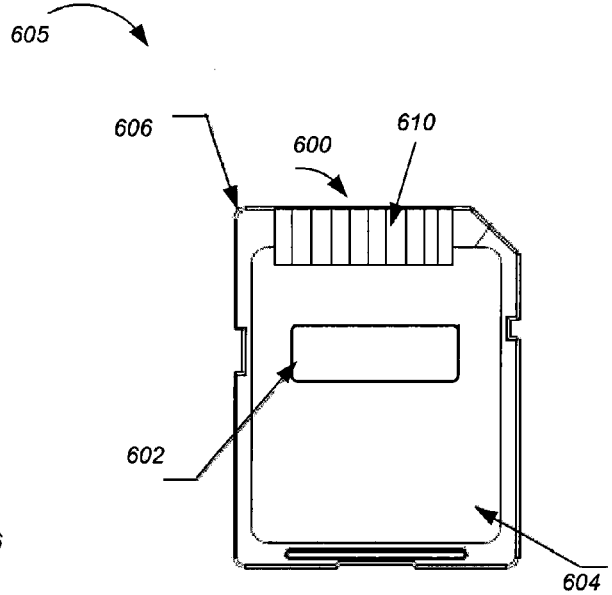
FIG. 6B shows a bottom view of the PC card of FIG. 6A.

FIG. 6A shows a top view 601 of a PC card 600 including a transparent portion 602. FIG. 6B shows a bottom view 605 of the PC card 600 of FIG. 6A. In addition to the transparent portion 602, the PC card 600 includes a base 604, a lid 606, and electronic device 608 that is partially enclosed by the base 604 and the lid 606.

As with the PC card 100 shown in FIG. 1, the base 604 can be manufactured, for example, by injection molding or die-cutting. The lid 606 can be manufactured, for example, by injection molding, die-cutting, or over-molded into position.

The lid 606 and base 604 include an opening in a surface of the lid 606 and base 604, respectively, corresponding to the transparent portion 602. The opening in each surface is smaller than the surface area of the lid 606 or base 604. Additionally, as shown in FIGS. 6A and 6B, the exposed surface area of the transparent portion 602 is smaller on the base 604 than the lid 606.

The transparent portion 602 is positioned to provide visual inspection of a portion of the electronic device 608. For example, the transparent portion allows information written, printed, or adhered onto the electronic device 608 to be viewed (e.g., capacity, manufacturer logo, security tag, or hologram). Additionally, the transparent portion 602 allows information about the size of the electronic device 608 to be viewed. The transparent portion 602 can also be used with a security feature, e.g., as described with respect to FIG. 5 above.

Figure 6C:
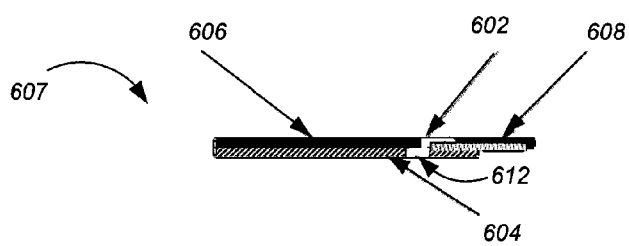
FIG. 6C shows a cross sectional view along line A-A of the PC card shown in FIG. 6A.

FIG. 6C shows a cross sectional view 607 along line A-A of the PC card 600 shown in FIG. 6A. The cross sectional view 607 shows the base 604, the lid 606, electronic device 608, and transparent portion 602. The base 604 and lid 606 form a bottom and top, respectively, for the PC card 600. The electronic device 608 is positioned between the base 604 and the lid 606.

As shown in FIG. 6C, the transparent portion 602 has a Z-shaped cross section 612. The Z-shaped cross section 612 defines an interior region configured to wrap around a portion of the electronic device 608. In some implementations, the Z-shaped cross section 612 is configured to hold the electronic device 608 in position (e.g., during assembly of the PC card 600, the transparent portion 602 can hold the electronic device 608 in place while lid 606 is positioned).

Additionally, as shown in FIG. 6C, the transparent portion 602 extends through the lid 606 and base 604 such that the transparent portion 602 is exposed from both the top and the bottom of the PC card 600. In some implementations, the transparent portion 602 wraps around a portion of the electronic device 608, the remainder of the electronic device 608 is held by the base 604 and lid 606 of the PC card 600. As shown in FIG. 6C, the Z-shaped cross section 612 includes a first portion that includes surface that exposes a portion of the electronic device 608 through the lid 606. As described above, this allows characteristics of the electronic device 608 to be observed. The Z-shaped cross section 612 also includes a second portion that includes a surface that exposes a portion of the housing through the lid 606. For example, the exposed portion can be a bottom surface of the lid 604. In some implementations, a security feature (e.g., a hologram) can be positioned between the transparent portion 602 and the lid 606.

A number of cross sectional shapes for the transparent portion have been described. Other cross sections Add text that other shapes configurations can be used. Additionally, the exposed surface or surfaces of the transparent portion (e.g., the externally visible portion) can have one or more shapes other than the generally rectangular shapes shown. For example, the exposed surface can be circular, oval, square, or otherwise shaped.

In some implementations, the transparent portion is replaced with a void. For example, the PC card 100 shown in FIGS. 1A-D can be identically configured except for the absence of the transparent portion 102. The void allows visual inspection of the electronic device 108 through the housing of the PC card 100.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. An apparatus comprising:
   a base including a base aperture:
   an electronic device positioned on the base;
   a lid positioned to cover the base and at least a portion of the electronic device, the lid and the base forming a housing for the electronic device, the lid including a lid aperture, the lid aperture exposing at least a portion of the electronic device, and where the lid surrounds and forms a perimeter of the lid aperture; and
   a transparent portion positioned such that a first region of the transparent portion is positioned within the lid aperture and where at least a portion of the electronic device is covered by the transparent portion,
   where the transparent portion includes:
   a top panel corresponding to the lid aperture,
   a bottom panel corresponding to the base aperture, and
   a side panel coupling the top panel and the bottom panel, where the transparent portion has a substantially U-shaped cross section.

2. The apparatus of claim 1, where the top panel has a surface area less than the surface area of the lid.

3. The apparatus of claim 1, where the electronic device is partially positioned within a cavity formed by the U-shaped cross section of the transparent portion.

4. The apparatus of claim 1, where the transparent portion holds the electronic device in position relative to the base during assembly.

5. The apparatus of claim 1, where the portion of the electronic device covered by the transparent portion includes identifying information.

6. The apparatus of claim 5, where the identifying information includes printed data.

7. The apparatus of claim 5, where the identifying information includes a size of the electronic device.

8. The apparatus of claim 5, where the identifying information is illuminated when exposed to a particular light source.

9. The apparatus of claim 1, where the lid includes a second lid aperture, the apparatus further comprising:
   a transparent panel positioned on the base, the transparent panel configured to fit within the second lid aperture.

10. The apparatus of claim 9, further comprising:
    a holographic layer, the holographic layer positioned between the base and the transparent panel.

11. The apparatus of claim 1, where the lid includes a recess, the apparatus further comprising:
    a transparent panel positioned within the recess.

12. The apparatus of claim 11, further comprising:
    a holographic layer, the holographic layer positioned between the lid and the transparent panel.

13. An apparatus comprising:
    a base:
    an electronic device positioned on the base;
    a lid positioned to cover the base and at least a portion of the electronic device, the lid and the base forming a housing for the electronic device, the lid including a lid aperture, the lid aperture exposing at least a portion of the electronic device, and where the lid surrounds and forms a perimeter of the lid aperture; and
    a transparent portion positioned such that a first region of the transparent portion is positioned within the lid aperture and where at least a portion of the electronic device is covered by the transparent portion,
    where the transparent portion includes:
    a top panel corresponding to the lid aperture, and
    a side panel coupled to the top panel,
    where the transparent portion has a substantially L-shaped cross section.

14. The apparatus of claim 13, where the transparent portion holds the electronic device in position relative to the base during assembly.

15. The apparatus of claim 13, where the portion of the electronic device covered by the transparent portion includes identifying information.

16. The apparatus of claim 15, where the identifying information includes printed data.

17. The apparatus of claim 15, where the identifying information includes a size of the electronic device.

18. An apparatus comprising:
    a base:
    an electronic device positioned on the base;

a lid positioned to cover the base and at least a portion of the electronic device, the lid and the base forming a housing for the electronic device, the lid including a lid aperture, the lid aperture exposing at least a portion of the electronic device, and where the lid surrounds and forms a perimeter of the lid aperture; and a transparent portion positioned such that a first region of the transparent portion is positioned within the lid aperture and where at least a portion of the electronic device is covered by the transparent portion, where the transparent portion includes:
a top panel corresponding to the lid aperture,
a bottom panel, and
a side panel coupling the top panel and the bottom panel,
where the transparent portion has a substantially Z-shaped cross section.

19. The apparatus of claim 18, where the base includes an aperture and the bottom panel of the transparent portion corresponds to the base aperture.

\* \* \* \* \*